United States Patent

Otani et al.

[11] Patent Number: 5,980,762
[45] Date of Patent: Nov. 9, 1999

[54] METHOD OF MICROMACHINING A SEMICONDUCTOR

[75] Inventors: Hiroshi Otani; Masahiro Tsugai, both of Tokyo, Japan

[73] Assignee: Mitsubishi Denki Kabushiki Kaisha, Tokyo, Japan

[21] Appl. No.: 08/806,150

[22] Filed: Feb. 25, 1997

[30] Foreign Application Priority Data

Sep. 2, 1996 [JP] Japan ................................. 8-232136

[51] Int. Cl.⁶ ................................................. H01L 21/302
[52] U.S. Cl. .............................. 216/2; 216/51; 216/99; 438/50
[58] Field of Search .................... 216/2, 84, 99, 216/51; 438/50

[56] References Cited

U.S. PATENT DOCUMENTS

| | | | |
|---|---|---|---|
| 3,579,057 | 5/1971 | Stoller | 317/234 |
| 4,717,681 | 1/1988 | Curran | 437/31 |
| 4,758,368 | 7/1988 | Thompson | 252/79.5 |
| 5,096,535 | 3/1992 | Hawkins et al. | 156/633 |
| 5,201,987 | 4/1993 | Hawkins et al. | 156/633 |
| 5,589,083 | 12/1996 | Ahn et al. | 216/24 |
| 5,676,851 | 10/1997 | Suzuki et al. | 216/2 |
| 5,711,891 | 1/1998 | Pearce | 216/51 |
| 5,804,090 | 9/1998 | Iwasaki et al. | 216/99 |
| 5,883,012 | 3/1999 | Chiou et al. | 216/41 |

FOREIGN PATENT DOCUMENTS

| | | |
|---|---|---|
| 4037202 A1 | 5/1992 | Germany . |
| 53-003081A | 1/1978 | Japan . |
| 53-3081 | 1/1978 | Japan . |
| 7-201806 | 8/1995 | Japan . |

OTHER PUBLICATIONS

Kendall, D.L. "On etching very narrow grooves in silicon" Appl. Phys. Lett. 26(4) 195–198, Feb. 1975.

Tsugai, M. et al "Capacitive Accelerometer Realized with (110) Si Bulk Micromachining", Jul. 1996.

Masahiro Tsugai, et al., "Capacitive Accelerometer Realized with (110)SI Bulk Micromachining" Jul. 22,1996.

Primary Examiner—Bruce Breneman
Assistant Examiner—Anita Alanko

[57] ABSTRACT

A method of micromachining a silicon wafer that simultaneously forms narrow gaps having a width of 10 μm or less and wider gap portions using an anistropic etching solution. The etching solution contains KOH in a concentration of 35% or less and the penetration etching is carried out such that the etching of the opposing walls and the face of the silicon wafer occur at the same rate. A method of manufacturing a capacitance-type acceleration detector in a silicon wafer using the aforementioned etching method.

4 Claims, 3 Drawing Sheets

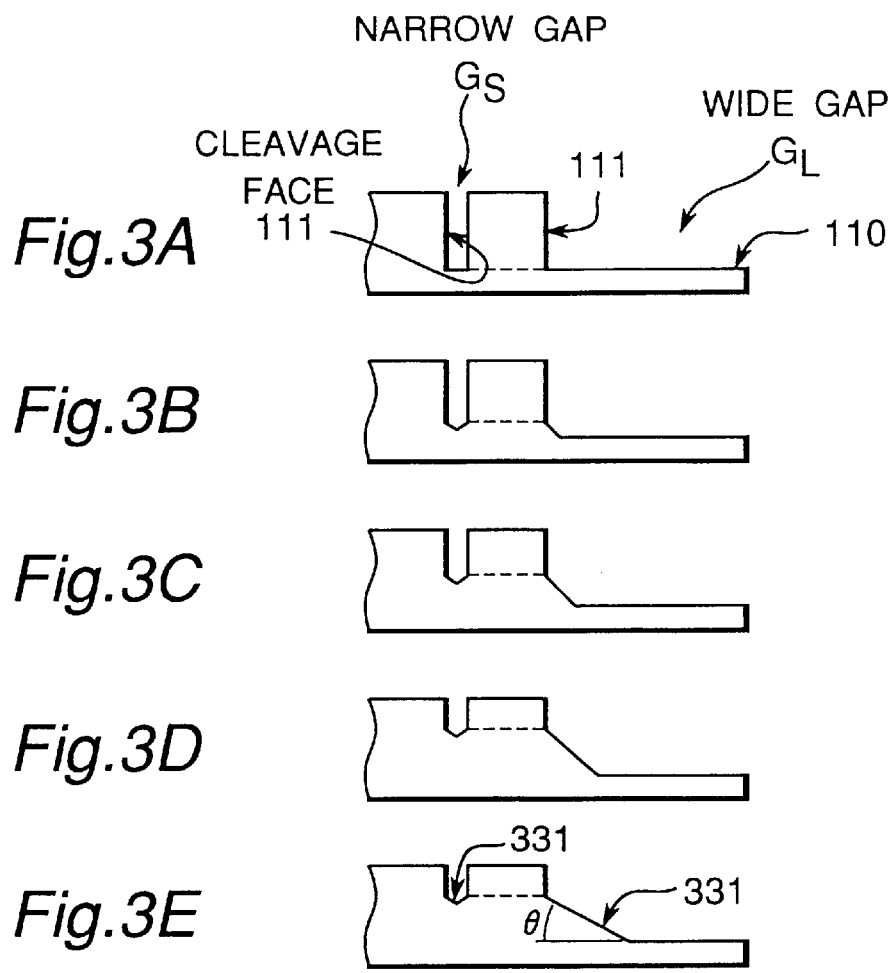
Fig. 3A, Fig. 3B, Fig. 3C, Fig. 3D, Fig. 3E
Fig. 4
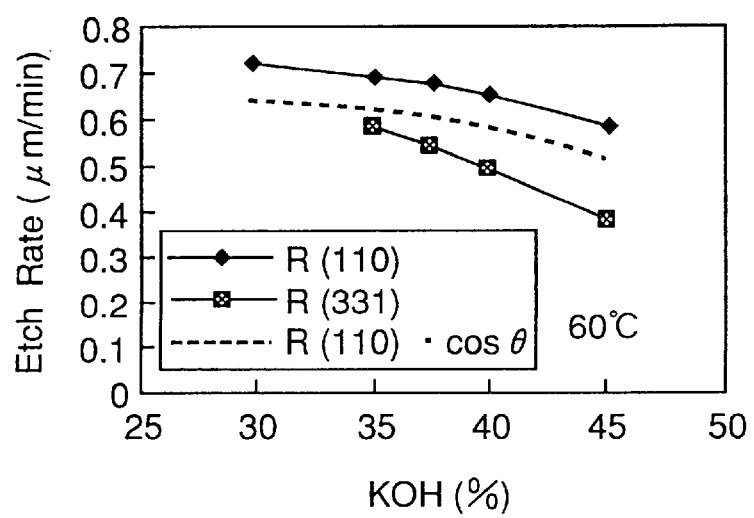

METHOD OF MICROMACHINING A SEMICONDUCTOR

BACKGROUND OF THE INVENTION

1. Field of the Invention

The present invention relates generally to a method of micromachining a semiconductor and, more particularly, to an anisotropic etching method of a silicon wafer, which is capable of forming gap portions such as a narrow gap portion and a comparatively wide gap portion disposed in an internal electrode portion of, for example, an acceleration detector, without any degradation of an element construction by means of a penetration etching.

2. Description of Related Art

In recent years, the technical development of an acceleration detector utilizing bulk micromachining and surface micromachining of semiconductors has been being made actively. The reason is that the significant increasing of demand for acceleration detectors used in an altitude control, a brake control and an air bag system can be prospected given the increased use of semi-conductors in motor vehicles, and given the mass production of downsized and low-cost detectors is becoming possible substrate. In addition, since an acceleration detector of the capacitive detection type has such advantages that the detector construction is comparatively simple, the temperature dependency is small and the self-diagnostics of the detector can be readily carried out by using an electrostatic power, various research and development efforts for that detector type are taking place. Particularly, there is an recent emphasis on research of the monolithic acceleration detector which has both a detector structure fabricated by the surface micromachining and a detection circuit IC that is integrally formed. The inventor of the present invention intended to obtain a trial construction of the acceleration detector 1 of the capacitive type having the internal electrode completely hermetically sealed by the three-layer structure comprising a glass layer 10, a silicon wafer layer 20 and a glass layer 30 as shown in FIG. 2 by making use of the bulk micromachining technology having a comparatively well completed technology and a good characteristic of the silicon wafer (110) for the anisotropic etching. That is, the silicon wafer layer 20 comprises a movable electrode 21, stationary electrodes 22, 23 disposed on the opposite sides of the movable electrode 21, a joist 24 for supporting the movable electrode 21, anchoring portions 25, and an auxiliary supporting portion 26 (FIG. 1) for use in obtaining the sealing structure of the element, and for detecting a displacement of the movable electrode 21 in the direction of the arrow through a signal detecting circuit (not illustrated) so as to obtain a voltage output proportional to the displacement of the movable electrode. In the trial construction of this detector, the anisotropic wet etching by a solution of KOH is applied to the silicon wafer face (110) for forming the internal electrode. Thereupon, since an etching rate for faces (111) providing wall surfaces of an etched groove perpendicular to the face (110) is smaller, namely about ¹⁄₁₀₀ or less, in comparison to that of the face (110), when using this characteristic, it becomes possible to comparatively readily form a narrow gap electrode with a high aspect having the opposed faces (111). One such method is proposed using anisotropic etching as disclosed in Japanese Patent Publication (unexamined) No. 53-3081 and Japanese Patent Publication (unexamined) No. 7-201806.

In the acceleration detector 1, however, as shown in FIG. 3, when the narrow gap portion GS and the wider opening portion GL are formed in the face (110) of the silicon wafer by means of anisotropic etching method, since the etching rate in the direction of the face (111) is usually lower than the etching rate in the directions of other faces, there will appear the face (110) which is the bottom surface of the narrow gap portion GS, the wall face (111) perpendicular to the face (110) and inclined surfaces having an angle of 35.5 degree with respect to the face (110). Since a high index surface, which is the face (331), could be formed depending on the concentration of the etching solution of KOH, it was found that this etching rate difference would interfere with the penetration etching of the wafer and forming the groove of the narrow gap portion GS.

SUMMARY OF THE INVENTION

The present invention has been developed to overcome the above-described disadvantages.

It is accordingly an objective of the present invention to provide a method by which a penetration etching can be carried out without any hindrance to forming a narrow gap portion GS and forming an opening portion GL which is a comparatively wide gap portion through anisotropic wet etching using a solution of KOH applied to a silicon wafer (110).

The present invention resides in a method of micromachining a semiconductor comprising the steps of:

when gap portions formed by opposed faces (111) are formed as a narrow gap portion having a width of 10 μm or less and a wider gap portion in a silicon wafer (110) by means of anisotropic etching, setting R(331) and R(110) in accordance with the following formula (1) for said silicon wafer (110) while an etching solution containing KOH in a concentration of 35 percent by weight or less is used, $$R(331) \leq R(110) \cos \theta \quad (1)$$

where R(110) is an etching rate for the face (110), R(331) is an etching rate for the face (331), and θ is an angle defined by the face (110) and the face (331); and carrying out a penetration etching to simultaneously form the gap portions formed by said opposed faces (111) as the narrow gap portion GS having the width of 10 μm or less and the wider gap portion GL.

And then, a method of micromachining a semiconductor according to this invention has a feature that the concentration of KOH of said etching solution may be set to about 25–35 percent by weight.

Further, according to this invention, said silicon wafer (110) may be used in manufacturing an acceleration detector having a region which provides an internal electrode portion of the acceleration detector of the capacitive detection type having a three-layer stack construction comprising a glass layer, a silicon wafer layer and a glass layer and in which electrodes are partitioned off by the narrow gap portions having a width of 5 μm or less and an aspect ratio of 20 or more.

BRIEF DESCRIPTION OF THE DRAWINGS

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

The present invention will become more fully understood from the detailed description given hereinbelow and the accompanying drawings which are given by way of illustration only, and thus are not limitative of the present invention, and wherein:

FIGS. 3A, 3B, 3C, 3D, and 3E are sectional views showing the etched conditions of the narrow gap portion GS and the opening portion GL with respect to the respective concentrations of KOH, namely to 30 percent by weight, 35 percent by weight, 37.5 percent by weight, 40 percent by weight and 45 percent by weight;

FIG. 4 is a graph showing the relations between the concentrations of KOH and the etching rates of respective face (110) and face (331)

DETAILED DESCRIPTION OF THE PREFERRED EMBODIMENTS

Figure 1:
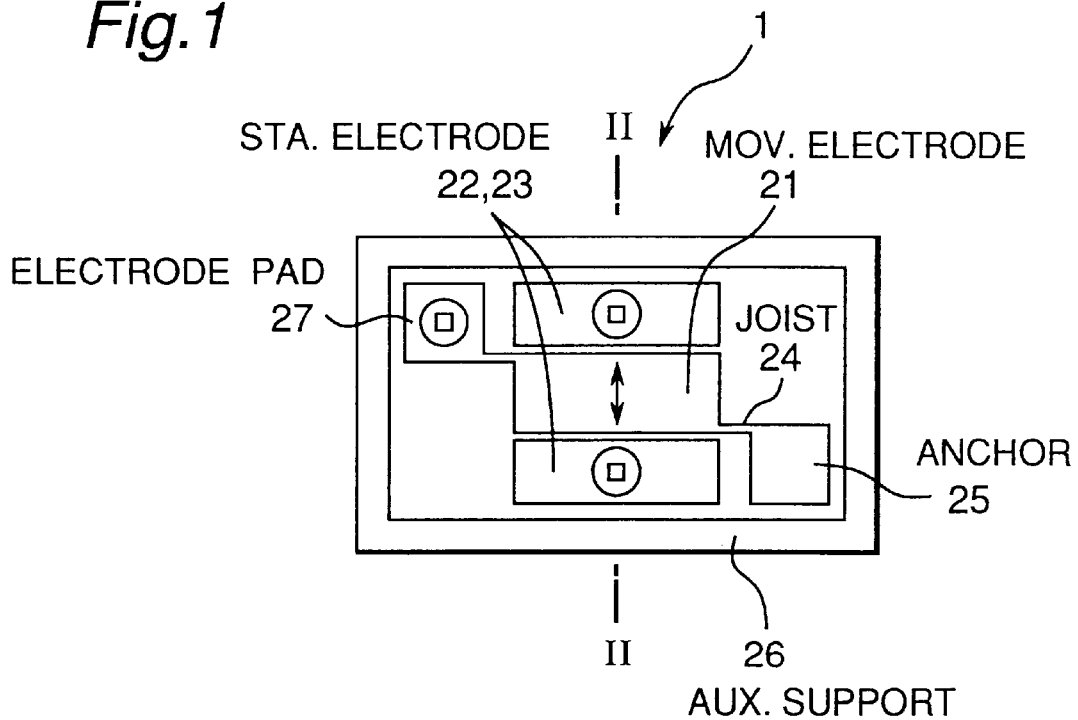
FIG. 1 is a schematic top plan view of an acceleration detector of the capacitive detection type manufactured according to the present invention.

An embodiment of the present invention will be explained hereinafter with reference to the attached drawings.

When an anisotropic etching which employs a solution of KOH is applied to a silicon wafer (110), etched conditions of the silicon wafer (110) by various kinds of concentrations of KOH were observed.

That is, when the concentration of KOH was changed from 30 percent by weight to 45 percent by weight at the time of micromachining of the silicon wafer (110), the etched conditions of the silicon wafer (110) as shown in FIGS. 3A to 3E were obtained as the observation results in sectional views of the wafer about a narrow gap portion (having a width of 10 µm) and a very large gap portion (an opening portion). FIGS. 3A to 3E are sectional views showing the etched conditions of the narrow gap portion GS and the opening portion GL with respect to the respective concentrations of KOH, namely to 30 percent by weight, 35 percent by weight, 37.5 percent by weight, 40 percent by weight and 45 percent by weight. That is, (1) it can be understood that, in the case of a concentration of KOH being 30 percent by weight, the etching to the face (110) proceeds substantially at the same speed in both the narrow gap portion GS and in the opening portion GL (the wide gap portion) (refer to FIG. 3A).

(2) In the case of 35 percent by weight, however, a face (331) begins to appear (refer to FIG. 3B).

(3) When the concentration of KOH becomes more than 35 percent by weight, that is in the cases of 37.5 percent by weight, 40 percent by weight and 45 percent by weight, groove depths in the narrow gap region are defined by the etching rates of the face (331) (refer to FIGS. 3C to 3E).

(4) Though the face (331) is formed in the opening portion GL, it can be understood that the groove depths therein are defined by the etching rate of the face (110) (refer to FIGS. 3C to 3E).

The graph of FIG. 4 is obtained by calculating the etching rates of the face (110) and the face (331) from measured values of etching time and depth and arranging them in order of the concentrations of KOH.

Although the etching rate R(110) in the face (110) is higher than the etching rate R(331) in the face (331) at every concentration of KOH, both of these etching rates approach to each other as the concentration becomes lower. Therefore, a limit of formation of the face (331) is as follows.

$$R(331) \leq R(110) \cos \theta \tag{1}$$

where θ is an angle (26.6 degree) defined by the face (110) and the face (331), and the concentration of KOH at which the equation is established exists between 30 percent by weight and 35 percent by weight of KOH.

In the penetration etchings applied to the narrow gap portion GS and the comparatively wide gap portion GL (the opening portion) between an auxiliary supporting portion and a stationary electrode, owing to the above-mentioned fact, it becomes possible to prevent a remarkable disparity of the penetration times from being produced by a difference in the etching rates in the face (331) and in the face (110). As a result, it becomes possible to minimize the degradation of the element structure which might be caused by side etching as a result of the disparity of the penetration times.

Though it is possible to minimize the degradation of the element structure which might be caused by side etching as result of by the disparity of the penetration times by utilizing the etching solution having the KOH concentration of 35 percent by weight or less, the etching rate scatters in a range of less than 25 percent by weight, so that an accurate etching becomes impossible. Therefore, it is preferable to set the KOH concentration of the etching solution to 25–35 percent by weight, and it is the most preferable to set it to about 30 percent by weight at an etching solution temperature of 60 degree centigrade.

Next, the manufacturing process of the acceleration detector of the capacitive detection type shown in FIG. 1 will be explained with reference to FIGS. 5A to 5E.

Figure 2:
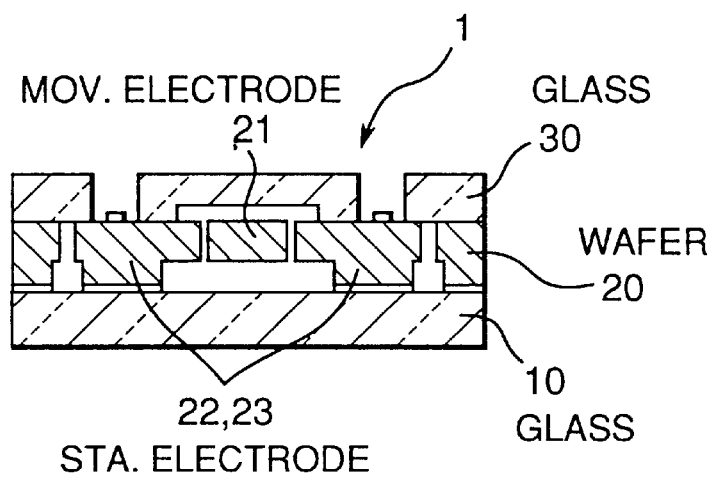
FIG. 2 is a sectional view taken along line II—II in FIG. 1.

This acceleration detector 1 has a three-layer structure comprising a glass layer 10, a silicon wafer layer 20 and a glass layer 30. As shown in FIG. 2, the silicon wafer layer 20 disposed at the intermediate position is formed as the internal electrode portion and comprises a movable electrode (a mass body) 21, stationary electrodes 23, 23 disposed on opposite sides of that electrode 21, joists 24, 24 for supporting the mass body 21, an anchoring portion 25 connected to the joist 24, and an auxiliary supporting portion 26 for use in a sealed structure for those elements, wherein the acceleration detection is done unidirectionally in the direction indicated by the arrow in FIG. 1 along the wafer face. Also, the symbol 27 designates an electrode pad.

Firstly, the p type device wafer (110) is used herein as the device wafer layer 20 and is applied with the etching employing the solution of KOH in the direction of the face (111), in which an etching effect is measured with an angle accuracy to 0.1 degree. Then, the thermal oxidation is applied to the layer 20 (refer to FIG. 5A) to form the SiO$_2$ film on the surfaces of the layer 20.

After the patterning of the oxide film 20a on the backside, the anisotropic etching by the KOH etching solution is applied thereto to form a middle wide groove 20b and narrow grooves 20c on the opposite sides of the groove 20b and then the thermal oxidation is applied thereto again (refer to FIG. 5B).

Then, the device wafer layer 20 and the glass layer (made of the Pyrex glass) 10 are connected to each other by means of anodic joining. After that, the electrode pad 27 is formed by means of sputtering and the lift-off method, and the oxide film patterning for forming the detector structure is carried out by means of RIE (Reactive Ion etching) (refer to FIG. 5C).

Figure 5A:
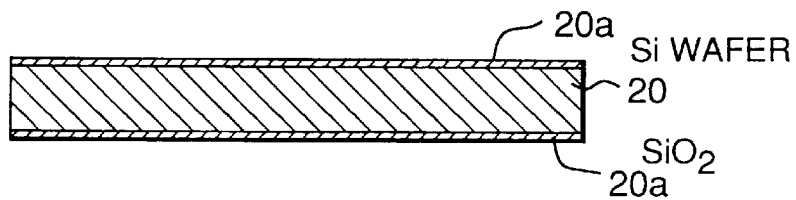
FIGS. 5A, 5B, 5C, 5D, and 5E are sectional views respectively showing a thermal oxidation process, a surface etching and thermal oxidation process, an anodic joining, electrode forming and oxide film patterning process, an etching and releasing process, and an anodic joining process of the acceleration detector of the capacitive detection type, which employs a method according to the present invention.
Figure 5B:
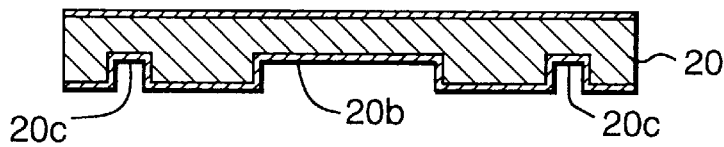
Figure 5C:
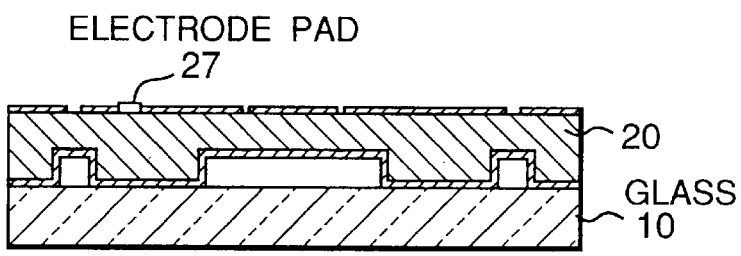
Figure 5D:
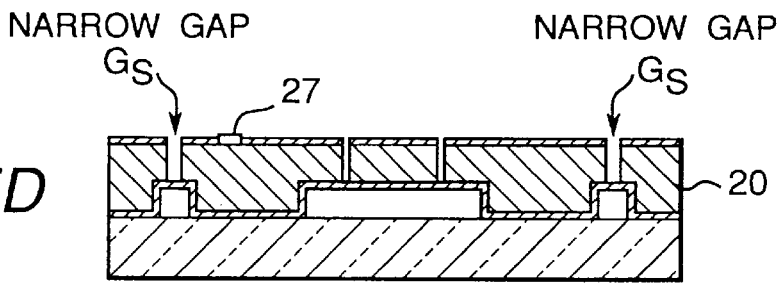
Figure 5E:
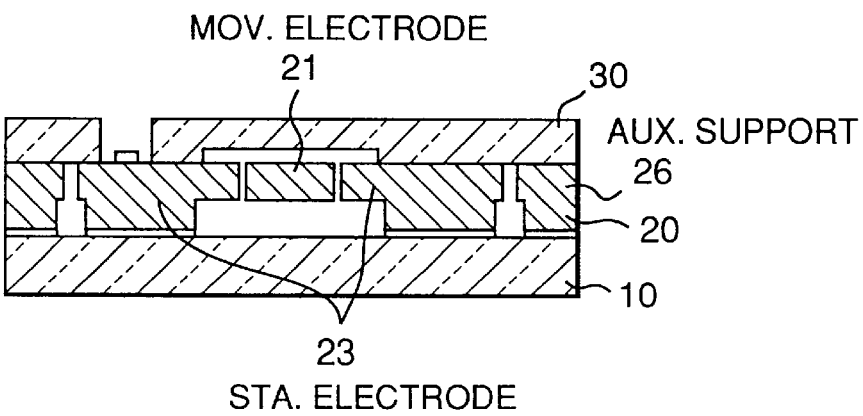

Subsequently, the anisotropic etching is carried out by using the etching solution containing KOH in an amount of 30 percent by weight (refer to FIG. 5D). Thereupon, since a minimal initial electrode gap is 2 μm in width, the etching rate in the narrow gap region is improved by an addition of a surface-active agent for the purpose of lowering of a surface tension and then the etching is carried out with the addition of ultrasonic wave. The narrow gap portion GS obtained thereby has a width of 5 μm or less and an aspect ratio of 20 or more, preferably about 25.

At this stage, a structure of the acceleration detector is completed. After that, the oxide film is removed by using BHF (Buffered Hydro Fluoride), so that the mass body is released.

On one hand, an upper Pyrex glass 30 is prepared for hermetically sealing a detecting portion of the detector element, and a concave portion 31 is formed in such region as to face the movable electrode 21 as well as a through-hole 32 is formed in such a region as to face the electrode pad 27 respectively by means of ultrasonic machining. After that, this upper Pyrex glass 30 and the device wafer 20 are aligned and connected to each other by means of anodic joining (refer to FIG. 5E).

As clearly understood from the above-mentioned description, according to the present invention, since the anisotropic etching is applied to the silicon wafer (110) so that the narrow gap portion GS and the wide gap portion (the opening portion) can be formed simultaneously by the penetration etching, it becomes possible to prevent the side etching from being induced by a disparity of the penetration time caused by a difference between the etching rates in the face (331) and in the face (110) as well as to carry out the micromachining of the semiconductor while minimizing the degradation of the element structure.

According to a preferable embodiment, since the narrow gap portion having a width of 10 μm or less, preferably 5 μm or less and a high aspect ratio, preferably an aspect ratio of 20 or more and the wider gap opening portion can be formed simultaneously by the penetration etching, it becomes possible to manufacture the acceleration detector of the capacitive detection type having the narrow gap portion GS and the wide gap opening portion GL by means of micromachining technology.

Further, when the KOH concentration of the etching solution is set to 25–35 percent by weight, the etching rate doesn't scatter so that it becomes possible to carry out the accurate penetration etching.

The invention being thus described, it will be obvious that the same may be varied in many ways. Such variations are not to be regarded as departure from the spirit and scope of the invention, and all such modifications as would be obvious to one skilled in the art are intended to be included within the scope of the following claims.

What is claimed is:

1. A method of micromachining a semiconductor comprising the steps of:

simultaneously forming a narrow gap portion having opposing walls and a wider gap portion said narrow gap portion having a width of 10 μm or less between said opposing walls in a silicon wafer (110) by anisotropic etching, using an etching solution containing KOH in a concentration of 35 percent by weight or less where the anisotropic etching rate for said opposing walls and a face of the silicon wafer (110) are substantially equal to one another wherein said narrow gap portion and said wide gap portion formed by simultaneous etching have approximately equal depths.

2. The method according to claim 1, wherein the concentration of KOH of said etching solution is set to 25–35 percent by weight.

3. A method of manufacturing a capacitance-type acceleration detector having a three-layer stack construction of an upper glass layer, a silicon wafer layer (110), and a lower glass layer comprising the steps of:

forming internal electrode portions in a silicon wafer (110) wherein said forming step includes, simultaneously forming narrow gap portions having opposing walls and wider gap portions, said narrow gap portions having a width of 5 μm or less between said opposing walls in a silicon wafer (110) and having an aspect ratio of 20 or more by anisotropic etching using an etching solution containing KOH in a concentration of 35 percent by weight or less where the anisotropic etching rate for said opposing walls and a face of the silicon wafer (110) are equal to one another, wherein said narrow gap portion and said wide gap portion formed by simultaneous etching have approximately equal depths, and said internal electrodes are partitioned by said narrow gap portions.

4. The method according to claim 3, wherein the concentration of KOH of said etching solution is set to 25–35 percent by weight.

* * * * *